US 6,603,106 B2

(12) United States Patent
Teranuma et al.

(10) Patent No.: US 6,603,106 B2
(45) Date of Patent: Aug. 5, 2003

(54) TWO-DIMENSIONAL IMAGE DETECTOR AND FABRICATION METHOD OF THE SAME

(75) Inventors: Osamu Teranuma, Tenri (JP); Yoshihiro Izumi, Kashihara (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/766,591

(22) Filed: Jan. 23, 2001

(65) Prior Publication Data
US 2001/0010352 A1 Aug. 2, 2001

(30) Foreign Application Priority Data
Jan. 27, 2000 (JP) ............................................ 2000-19334

(51) Int. Cl.⁷ ............................................. H01L 27/00
(52) U.S. Cl. ................................ 250/208.1; 250/370.08
(58) Field of Search ........................ 250/208.1, 370.08, 250/370.09, 370.13, 370.14, 370.15; 257/72, 290, 291, 443; 438/57, 73, 96, 97

(56) References Cited

U.S. PATENT DOCUMENTS

| 5,319,206 | A | 6/1994 | Lee et al. | |
| 6,262,408 | B1 * | 7/2001 | Izumi et al. | 250/208.1 |
| 6,392,217 | B1 * | 5/2002 | Teranuma et al. | 250/208.1 |

FOREIGN PATENT DOCUMENTS

| JP | 11-211832 A | 8/1999 |
| JP | 11-274448 A | 10/1999 |

OTHER PUBLICATIONS

Lee et al, "A New Digital Detector for Projection Radiography", SPIE vol. 2432, Medical Imaging 1995, Physics of Medical Imaging, May 1995, pp 237–249.

Jeromin et al, "8.4: Application of a–Si Active–Matrix Technology in a X–Ray Detector Pannel", SID 97 Digest, 1997, pp. 91–94.

\* cited by examiner

*Primary Examiner*—Kevin Pyo
(74) *Attorney, Agent, or Firm*—Nixon & Vanderhye P.C.

(57) ABSTRACT

The invention provides a two-dimensional image detector having superior uniformity in thickness and composition of a photoconductive layer with respect to the entire substrate, and a method of productively (efficiently) and inexpensively manufacturing such a two-dimensional image detector. The two-dimensional image detector includes at least an active matrix substrate 1 having a plurality of pixel electrodes 10, and a photoconductive layer 2 stacked on the pixel electrodes 10, wherein the photoconductive layer 2 is transferred to the active matrix substrate 1 after being formed in a predetermined thickness on a transfer substrate. That is, a fabrication method of the two-dimensional image detector is the method in which the photoconductive layer 2 is formed in advance in a predetermined thickness on the transfer substrate and then transferred on the active matrix substrate 1. The photoconductive layer 2 includes a mixture of particulate photoconductors and a binder. The binder preferably has a softening point which is not more than a heat resistant temperature of the active matrix substrate 1.

7 Claims, 5 Drawing Sheets

TWO-DIMENSIONAL IMAGE DETECTOR AND FABRICATION METHOD OF THE SAME

FIELD OF THE INVENTION

The present invention relates to a two-dimensional image detector that is suitably used for detecting a two-dimensional image of light (radiation rays) such as X-rays, visible light, or infrared rays, and a fabrication method of the same.

BACKGROUND OF THE INVENTION

Conventionally well-known as a detector for detecting a two-dimensional image of radiation rays is a two-dimensional image detector in which a plurality of semiconductor sensors that detect X-rays projected thereto and generate electric charges (electron-hole) are disposed on a two-dimensional plane, each semiconductor sensor being equipped with an electric switch. The two-dimensional image detector is arranged so as to detect a two-dimensional image by successively turning on the electric switches for each row to read electric charges generated by the semiconductor sensors for each column.

A principle and specific structure of the foregoing two-dimensional image detector is taught by, for instance, by the following documents: D. L. Lee et al., "A New Digital Detector for Projection Radiography", SPIE, 2432, pp.237–249, 1995"; L. S. Jeromin et al., "Application of a-Si Active Matrix Technology in a X-ray Detector Panel", SID 97 DIGEST, pp.91–94, 1997; and the Japanese Publication for Laid-Open Patent Publication No. 342098/1994 (Tokukaihei 6-342098 [Date of Publication: Dec. 13, 1994]). The foregoing two-dimensional image detector is formed as follows: a photoconductive layer that absorbs X-rays to generate electric charges is formed on an active matrix substrate having a plurality of electrode wires arranged in XY matrix, and switching elements and pixel electrodes which are provided at intersections of the foregoing electrode wires, and further, bias electrodes are formed on the foregoing photoconductive layer.

Further, for example, the foregoing document recites using a-Se (amorphous selenium) that has good sensitivity to X-rays and can easily be formed on a large-area substrate as a material for forming the photoconductive layer. a-Se exhibits a high X-ray absorption rate and a high conversion rate of X-rays to electric charges, and also, it is directly formed on an active-matrix substrate at a relatively low temperature by vapor deposition.

To improve the S/N ratio of the two-dimensional image detector, the quantity of the electric charges generated by X-ray absorption should be increased. However, to increase the quantity of electric charges, it is necessary to form the photoconductive layer to a thickness of about 500 $\mu$m to 1500 $\mu$m. Formation of such a thick photoconductive layer by vapor deposition, however, takes long time, and further, management of the process is complex. As a result, productivity suffers greatly, and the manufacturing costs of the two-dimensional image detector is increased. Moreover, in the method in which a photoconductive layer is directly provided on the active matrix substrate, the active matrix substrate is heated when forming the photoconductive layer. Therefore, the heat resistance (heat resistance temperature) of the active matrix substrate has to be taken into consideration. Therefore, in the foregoing method, it is difficult to use a material (for instance, CdTe, CdZnTe) which needs to be deposited at high temperatures as a material of the photoconductive layer.

A method intended to solve the foregoing problems is disclosed, for example, in the Japanese Publication for Laid-Open Patent Application No. 211832/1999 (Tokukaihei 11-211832 [Date of Publication: Aug. 6, 1999]) which teaches forming a photoconductive layer by a coating process, rather than vapor deposition. More specifically, in the foregoing method, a particle-dispersed material that is formed by dispersing particulate photoconductors in a binder such as insulating resin is coated to a thickness of about 700 $\mu$m to 3000 $\mu$m over the active matrix substrate, to form a photoconductive layer. This method allows the use of various materials (photoconductive materials) that exhibit high X-ray absorption rate and high X-ray-charge conversion rate, apart from the aforementioned a-Se, as the material of the photoconductors. Therefore, the photoconductive layer can be formed by combining such a material and the binder such as resin. Incidentally, since the foregoing method allows the photoconductive layer to be formed in a short time, a high productivity may be achieved while reducing the manufacturing cost of the two-dimensional image detector.

However, forming the photoconductive layer by the method as disclosed in the Japanese Publication for Laid-Open Patent Application No. 211832/1999 (Tokukaihei 11-211832) is bound to various problems which are commonly associated with the coating process. That is, in the case of forming the photoconductive layer on a large-area substrate by the spin-coating method, the thickness of the layer which can be evenly formed by a single spin-coating cannot be increased by more than around several microns. Further, in the case of forming the photoconductive layer on the substrate by a screen printing method, the thickness of the layer which can be evenly formed by a single screen printing cannot be increased by more than several ten microns. Thus, in order to form a photoconductive layer having a thickness of around 700 $\mu$m to 3000 $\mu$m by these coating methods, the coating process needs to be repeated at least ten to several ten times. As a result, the coating process takes time and the management of the process becomes complex, which results in low productivity and increased manufacturing cost of the two-dimensional image detector. Further, since the resulting photoconductive layer has a laminated structure, the thickness and composition of the photoconductive layer with respect to the entire substrate may become non-uniform. Similarly, it is also very difficult to evenly form the photoconductive layer of the foregoing thickness over the entire substrate by the method such as a roll-coater method, offset printing method, or spraying method.

That is, the conventional methods employing the coating process have a difficulty in productively (efficiently) and inexpensively manufacturing a two-dimensional image detector having superior uniformity in thickness and composition of the photoconductive layer with respect to the entire substrate.

SUMMARY OF THE INVENTION

The present invention was made to solve the foregoing problems and it is an object of the present invention to provide a two-dimensional image detector having superior uniformity in thickness and composition of a photoconductive layer with respect to the entire substrate, and a fabrication method of productively (efficiently) and inexpensively manufacturing such a two-dimensional image detector.

A first object of the present invention is to provide a two-dimensional image detector having superior uniformity in thickness and composition of a photoconductive layer with respect to the entire substrate.

In order to achieve the foregoing object, a two-dimensional image detector in accordance with the present invention includes at least an active matrix substrate having a plurality of pixel electrodes, and a photoconductive layer stacked on the pixel electrodes, wherein the photoconductive layer is transferred onto the active matrix substrate after being formed on a transfer substrate.

With this arrangement, since the photoconductive layer is formed in advance in a predetermined thickness on a discrete substrate, compared with the case where the photoconductive layer is directly formed (deposited) on the active matrix substrate by the vacuum vapor deposition method or coating method, the material, method, and condition of forming the photoconductive layer can be suitably selected from a wider selection (wider selection is available). That is, because the photoconductive layer is not directly formed on the active matrix substrate, the material, method, and condition of forming the photoconductive layer can be suitably selected from a wide selection irrespective of the heat resistant temperature of the active matrix substrate. Therefore, the photoconductive layer can employ various materials (photoconductive materials) for which, for example, the vacuum vapor deposition method was difficult to apply, and productivity of the photoconductive layer can be improved. Further, it is possible to easily form a photoconductive layer having superior uniformity in thickness and composition and having a (wide) thickness of, for example, 700 $\mu$m to 3000 $\mu$m. Further, since the photoconductive layer is not directly formed on the active matrix substrate, the photoconductive layer can also be formed easily on the active matrix substrate having a large area. As a result, it is possible to productively (efficiently) and inexpensively (easily) provide a two-dimensional image detector having superior uniformity in thickness and composition of the photoconductive layer with respect to the entire active matrix substrate.

A second object of the present invention is to provide a method of productively (efficiently) and inexpensively (easily) manufacturing a two-dimensional image detector having superior uniformity in thickness and composition of the photoconductive layer with respect to the entire substrate.

In order to achieve the second object, the fabrication method of the two-dimensional image detector in accordance with the present invention includes the step of forming the photoconductive layer on a discrete substrate and then transferring the photoconductive layer onto the active matrix substrate having a plurality of pixel electrodes.

With this method, it is possible to provide a fabrication method of the two-dimensional image detector having the foregoing effects.

For a fuller understanding of the nature and advantages of the invention, reference should be made to the ensuing detailed description taken in conjunction with the accompanying drawings.

DESCRIPTION OF THE EMBODIMENTS

First Embodiment

The following description will explain one embodiment of the present invention referring to FIG. 1 through FIG. 6. Note that, a device for detecting X-rays, that is, an X-ray two-dimensional image detector is taken as an example of a two-dimensional image detector.

Figure 1:
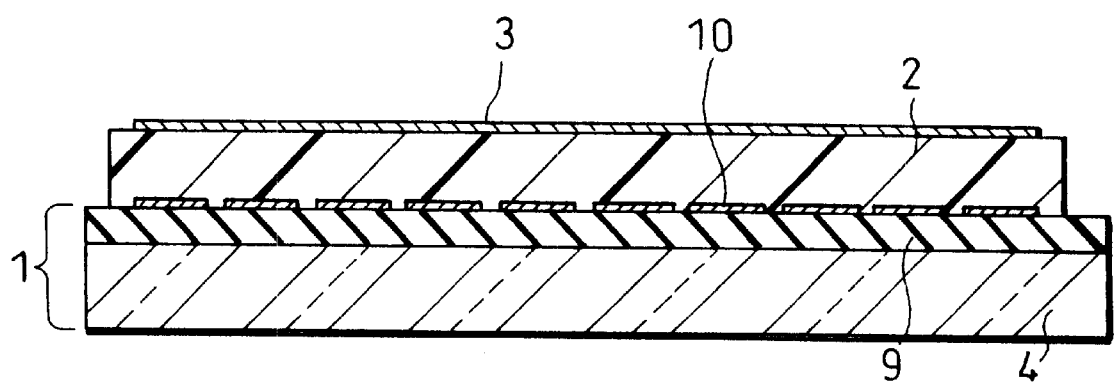
FIG. 1 is a cross sectional view showing a schematic arrangement of a two-dimensional image detector in accordance with one embodiment of the present invention.
Figure 2:
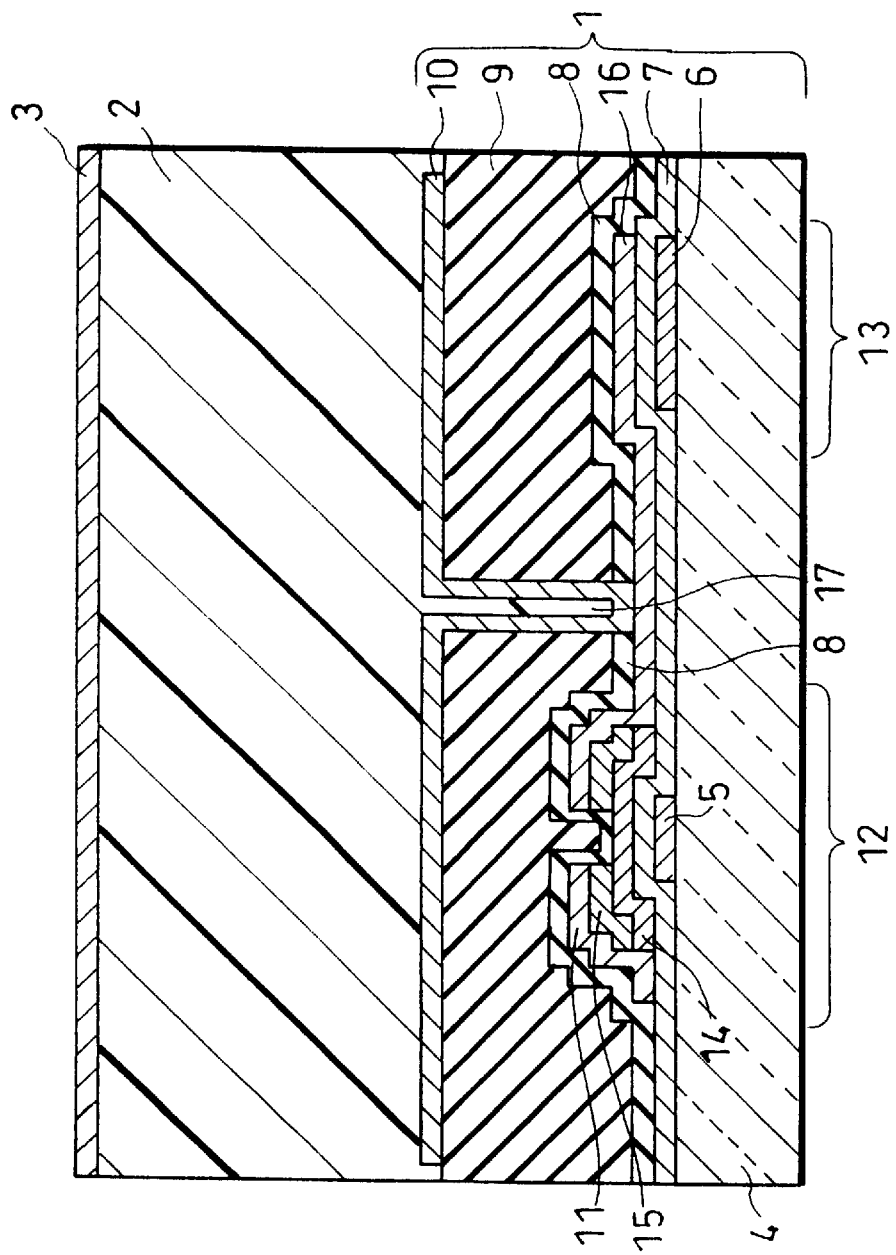
FIG. 2 is a cross sectional view showing an arrangement of a main portion (pixel) of the two-dimensional image detector.

In an X-ray two-dimensional image detector in accordance with the present embodiment, as shown in FIG. 1 and FIG. 2, a principal part thereof is formed by laminating a photoconductive layer 2 and common electrodes 3 on an active matrix substrate 1.

The active matrix substrate 1 is formed by laminating, on a glass substrate 4, scanning lines (not shown), signal lines (not shown), gate electrodes 5, charge storing capacitor electrodes (Cs electrodes) 6, gate insulating film (storing capacitor) 7, a-Si layer (i layer) 14, a-Si layer ($n^+$ layers) 15, source electrodes 11, drain electrodes 16, first insulating protect film 8, second insulating protect film 9, pixel electrodes 10, and the like. A TFT (thin film transistor) element 12 as a switching element is composed of the gate electrodes 5, the gate insulating film 7, the a-Si layers 14 and 15, the source electrodes 11, and the like, while a charge storing capacitor (Cs) 13 is composed of the charge storing capacitor electrodes 6, the gate insulating film 7, the drain electrodes 16, and the like. A non-alkali glass is suitable as the foregoing glass substrate 4.

The foregoing gate electrodes 5 are connected to the scanning lines, while the source electrodes 11 are connected to the signal lines. The scanning lines and signal lines as electrode wires are provided in a lattice form on the glass substrate 4. The foregoing TFT elements 12 are disposed at lattice points (intersections) of the foregoing electrode wires thus arranged in a lattice form. The pixel electrodes 10 are connected to the source electrodes 11 (signal lines) via the TFT element 12. Therefore, these electrode wires, the TFT elements 12, and the pixel electrodes 10 constitute a pixel array layer as an image detection region, and the active matrix substrate 1 is composed of the glass substrate 4 and the pixel array layer formed thereon. That is, the active matrix substrate 1 has the basic structure the same as that of common active matrix substrates used for liquid crystal display devices, etc.

In the case of fabricating an X-ray two-dimensional image detector used for X-ray radiography of the human body, the area of the image detection region of the active matrix substrate 1 is sufficiently, for example, a square of about 430 mm×430 mm with a pixel pitch of around 150 $\mu$m.

The gate electrodes 5 and the charge storing capacitor electrodes 6 are formed, for example, by a sputtering vapor deposition method, and made of a metal film such as tantalum or aluminium which has been patterned into a predetermined shape. The thickness of the metal film is to be around 300 nm but is not particularly limited. Note that, the scanning lines are formed together with the gate electrodes 5.

The gate insulating film 7 is made of an SiNx film or SiOx film, for example, formed by the CVD method. The thickness of the gate insulating film 7 is to be around 350 nm but is not particularly limited.

The a-Si layer (i layer) 14 and a-Si layer ($n^+$ layer) 15 are formed by being patterned into a predetermined shape on the gate insulating film 7 on the gate electrodes 5. The a-Si layers 14 and 15 are made of, for example, an a-Si film formed by the CVD method. The thickness of the a-Si layer (i layer) 14 is to be around 100 nm, and the thickness of the a-Si layer ($n^+$ layer) 15 is to be around 40 nm, but are not particularly limited.

The source electrodes 11 and the drain electrodes 16 are formed, for example, by the sputtering vapor deposition method, and are made of a metal film such as tantalum or aluminium which has been patterned into a predetermined shape. The thickness of the metal film is to be around 300 nm but is not particularly limited. Note that, the signal lines are formed together with the drain electrodes 16.

The first insulating protect film 8 is made of, for example, an SiNx film which has been formed by the CVD method. The thickness of the first insulating protect film 8 is to be around 300 nm but is not particularly limited.

The second insulating protect film 9 is, for example, an organic insulating film made of acrylic resin or other material having photoconductivity. The thickness of the second insulating protect film 9 is not particularly limited. Through a predetermined portion of the second insulating protect film 9 is formed a contact hole 17 for shorting the drain electrodes 16 and the pixel electrodes 10.

The pixel electrodes 10 are formed, for example, by the sputtering vapor deposition method, and is made of an ITO film which has been patterned into a predetermined shape. The thickness of the ITO film is to be around 150 nm but not particularly limited. The pixel electrodes 10 are shorted to the drain electrodes 16 through the contact hole 17 provided through the second insulating protect film 9.

The photoconductive layer 2 is stacked by being transferred onto the active matrix substrate 1 after being formed in a predetermined thickness on a discrete substrate ("transfer substrate" hereinafter). The photoconductive layer 2 is made up of a mixture of particulate photoconductors as a charge generating substance, and a binder for closing the spacing between the photoconductors. More specifically, the photoconductive layer 2 is made up of a particle-dispersed material in which the particulate photoconductors are uniformly dispersed in a specific proportion in the binder which maintains the sheet form of the photoconductive layer 2.

Specifically, the material of the photoconductor may be, but not limited to, for example, inorganic materials such as CdTe, CdZnTe, CdSe, CdS, ZnO, $PbI_2$, $TlI_2$, PbO, $HgI_2$, $Bi_{12}GeO_{20}$, $Bi_{12}SiO_{20}$, Se, SeAs, Si, SiC, SiGe, GaAs, and GaN; and organic materials such as titanyl phthalocyanine, metal phthalocyanine pigment, non-metal phthalocyanine, perylene pigment, polycyclic quinoline pigment, squalilium pigment, azulenium pigment, thiapyrylium pigment, and trisazo pigment. These materials may be used individually or in combination of two or more kinds. That is, these materials are used according to the wavelength of light (radiation) such as X-rays, visible light, or infrared rays, i.e., by suitably selecting a material having superior sensitivity to the light to be detected. In the case of fabricating the X-ray two-dimensional image detector, it is particularly preferable to use, among the various materials as exemplified above, CdZnTe which has superior sensitivity to the X-ray at ordinary temperature.

The photoconductor may be made into particles by any method. The particle size of the particles is not particularly limited and it is set depending on the material or amount of the photoconductor, or combination with the binder, and is preferably in a range of 0.01 μm to 0.5 μm, and more preferably 0.01 μm to 0.1 μm.

The material of the binder is selected, taking into consideration the thermal load which is applied on the substrate, for example, when heat-transferring the photoconductive layer on a common active matrix substrate. That is, in view of the fact that the heat resistant temperature of the common active matrix substrate is around 300° C., the binder preferably includes a material whose softening point is at or below the heat resistant temperature of the active matrix substrate, or more preferably at or below 200° C. Note that, in the present invention, as the term is used herein, the "softening point" indicates the temperature at which the material becomes soft, or at which adhesive property is exhibited (in case where two temperatures are present, the higher temperature indicates the softening point).

The material of the binder may be, for example, but not limited to, synthetic resin such as thermoplastic resin, a mixture of thermosetting resin and plasticizer (composition), and a mixture of thermoplastic resin and thermosetting resin (composition); and an organic semiconductor such as polysilane or polysilane compounds (derivatives), and organic/inorganic hybrid semiconductors. Also, specifically, the synthetic resin may be, for example, polyester resin, polyamido resin, polyether resin, polystylene resin, polyvinyl chloride resin, polyethylene resin, polypropylene resin, co-polymer resin of vinyl chloride and vinyl acetate, acrylic resin, urethane resin, epoxy resin, and a mixture of these resins. The materials of the binder may be used individually or in combination of two or more kinds. That is, the material of the binder is suitably selected according to the softening point or material, etc., of the photoconductor.

The method of dispersing the particulate photoconductors in the binder, i.e., the producing method of the particle-dispersed material is not particularly limited, and, for example, a stirring method or ultrasonic dispersion method can be suitably adopted. Also, the proportion of the photoconductors with respect to the binder is not particularly limited and it is set according to the materials, etc., of the photoconductors and the binder, but a proportion in a range of 50 mass % to 90 mass % is preferable, and 60 mass % to 80 mass % is more preferable.

Further, the binder may optionally contain additives, such as a plasticizer such as polypropylene glycol for adjusting the softening point, or a radiation resistant additive which contains aromatic amine or phenol for improving the X-ray resistant property of the photoconductive layer 2. The additives may be added by any method and in any amount. The binder is set and stabilized by a heating process or light irradiation process which is decided depending on the material.

Specifically, the transfer substrate which can be suitably used for supporting the photoconductive layer 2 when forming the photoconductive layer 2 in the form of a sheet includes, but not particularly limited to, for example, various films made of resin such as polyethylene terephthalate (PET), fluororesin, polycarbonate, polyethylene, and polypropylene. By using the transfer substrate, which is a flexible sheet, the photoconductive layer 2 in the form of a sheet can be formed continuously and further efficiently by a so-called roll-to-roll method.

The thickness of the photoconductive layer 2 is not particularly limited and it is set according to the material, etc., of the photoconductors or binder, and a range of about 700 μm to 3000 μm is preferable, and a range of about 1000 μm to 2500 μm is further preferable.

Note that, in order to further improve the S/N ratio of the two-dimensional image detector, it is preferable to provide, as required, a barrier layer for preventing injection of various charges with respect to the photoconductive layer 2, on the upper side or lower side, or more preferably on the both sides (upper and lower sides) of the photoconductive layer 2. The material of the barrier layer, and the method of forming the barrier layer are not particularly limited.

Figure 7:
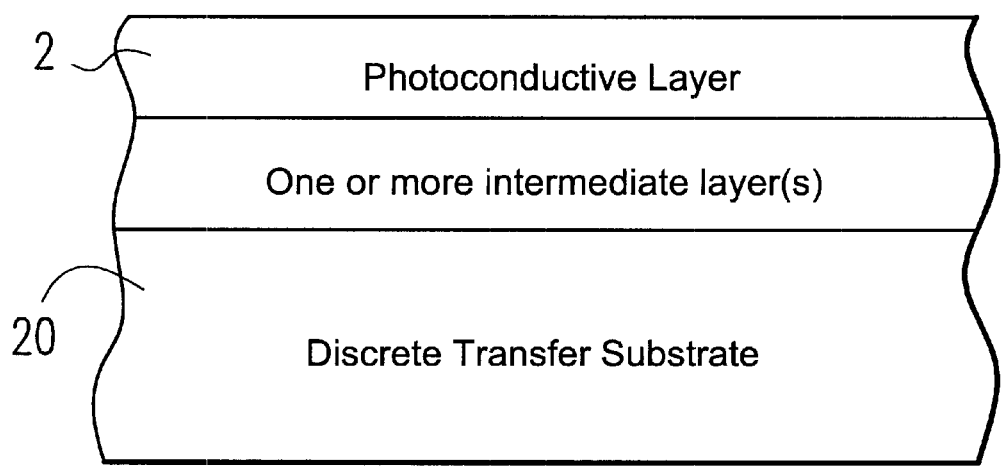
FIG. 7 is a cross sectional view of photoconductive layer on a discrete transfer substrate, with one or more intermediate layer(s) therebetween, according to an example embodiment of this invention.

Further, as shown in FIG. 7 for example, between the transfer substrate and the photoconductive layer 2 is provided, as required, a single or plurality of intermediate layers. By the provision of the intermediate layer, for example, even when the surface of the active matrix substrate 1, which is the target of the transfer substrate, has protrusions, the intermediate layer acts as a cushioning material to absorb the protrusions, thus making it easier to transfer the photoconductive layer 2 on the active matrix substrate 1. Further, case where the adhesion between the transfer substrate and the photoconductive layer 2 is greater than that between the photoconductive layer 2 and the active matrix substrate 1, the adhesion can be adjusted by the intermediate layer, thus making it easier to transfer the photoconductive layer 2 onto the active matrix substrate 1. Further, by the provision of the intermediate layer, the surface of the photoconductive layer 2 transferred to the active matrix substrate 1 can be protected. The material of the intermediate layer, and the method of forming the intermediate layer are not particularly limited. The intermediate layer can be removed appropriately at any time after the transfer of the photoconductive layer 2 onto the active matrix substrate 1 and before forming the common electrodes 3.

The common electrodes 3 are made of, for example, a gold (Au) film which is formed by the vacuum vapor deposition method. The thickness of the gold film is to be around 200 nm and is not particularly limited.

The following will describe an example of the fabrication method of the two-dimensional image detector having the described arrangement, with reference to FIG. 2 through FIG. 6. Note that, the fabrication method of the two-dimensional image detector is not to be limited by the following example.

First, as shown in FIG. 2, after depositing a metal film in a thickness of around 300 nm on the glass substrate 4 by the sputtering vapor deposition method, the metal film is patterned into a predetermined shape so as to form the gate electrodes 5 and the charge storing capacitor electrodes 6 (step 1). Then, an SiNx film or SiOx film is deposited in a thickness of around 350 nm on the glass substrate 4 by the CVD method so as to form the gate insulating film 7 (step 2).

Then, after depositing an a-Si film in a thickness of around 100 nm by the CVD method on the gate insulating film 7 on the gate electrodes 5, the a-Si film is patterned into a predetermined shape so as to form the a-Si layer (i layer) 14. On the a-Si layer 14 is deposited an a-Si film in the thickness of around 40 nm by the CVD method, which is then patterned into a predetermined shape to form the a-Si layer ($n^+$ layer) 15 (step 3).

Then, after depositing a metal film in a thickness of around 300 nm on the gate insulating film 7 by the sputtering vapor deposition method, the metal film is patterned into a predetermined shape so as to form the source electrodes 11 and the drain electrodes 16 (step 4). As a result, the TFT elements 12 and the charge storing capacitor 13 are formed.

Then, an SiNx film is deposited in the thickness of around 300 nm on the source and drain electrodes 11 and 16 by the CVD method, and a predetermined portion of the SiNx film, where the contact hole 17 is to be formed in the following step, is removed so as to form the first insulating protect film 8 (step 5).

Then, an organic insulating film of a predetermined thickness is deposited on the first insulating protect film 8 so as to form the second insulating protect film 9. Then, the second insulating protect film 9 is patterned by photolithography to form the contact hole 17 at a predetermined portion of the second insulating protect film 9 (step 6).

Then, after depositing an ITO film in a thickness of around 150 nm on the second insulating protect film 9 by the sputtering vapor deposition method, the ITO film is patterned into a predetermined shape so as to form the pixel electrodes 10. Here, the drain electrodes 16 and the pixel electrodes 10 are shorted through the contact hole 17 provided through the second insulating protect film 9 (step 7).

By carrying out the foregoing steps 1 through 7 subsequently, the active matrix substrate 1 having the TFT elements 12 and the charge storing capacitor 13 is fabricated. Note that, the fabrication method of the active matrix substrate 1 is not just limited by the foregoing example. The active matrix substrate 1 may be provided with various non-linear elements instead of the TFT elements 12. That is, the arrangement and material of the switching element are not just limited to the foregoing arrangement (TFT structure) and material.

Figure 3:
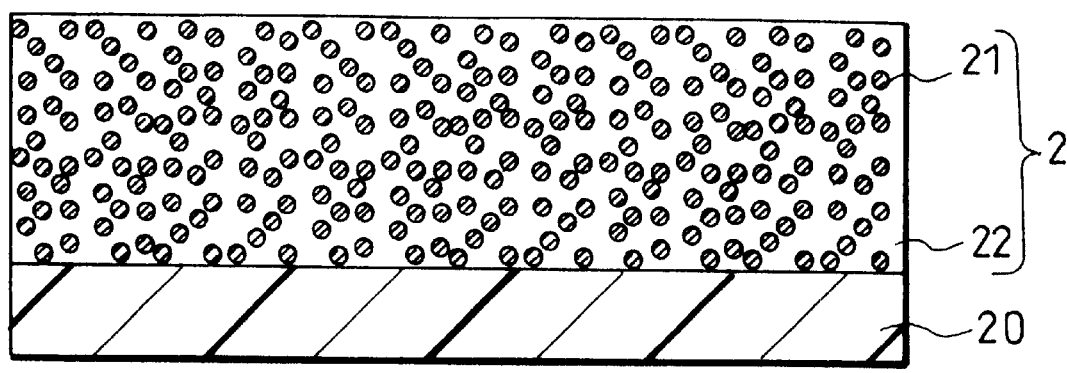
FIG. 3 is a cross sectional view showing a state in which a photoconductive layer making up the two-dimensional image detector is formed on a discrete substrate.

Meanwhile, as shown in FIG. 3, on the transfer substrate 20 is formed the photoconductive layer 2, for example, including particulate photoconductors 21 being uniformly dispersed in a binder 22 (step 8). This step is carried out appropriately at any time before the next step.

Then, the photoconductive layer 2 in the form of a sheet is transferred onto the active matrix substrate 1 (step 9). The photoconductive layer 2 may be transferred by a method, for example, such as a heat transfer method employing a lamination method, but the method is not particularly limited. The following will explain a transfer operation (transfer process) by which the photoconductive layer 2 is heat-transferred onto the active matrix substrate 1 by the lamination method, with reference to FIG. 4 through FIG. 6.

Figure 4:
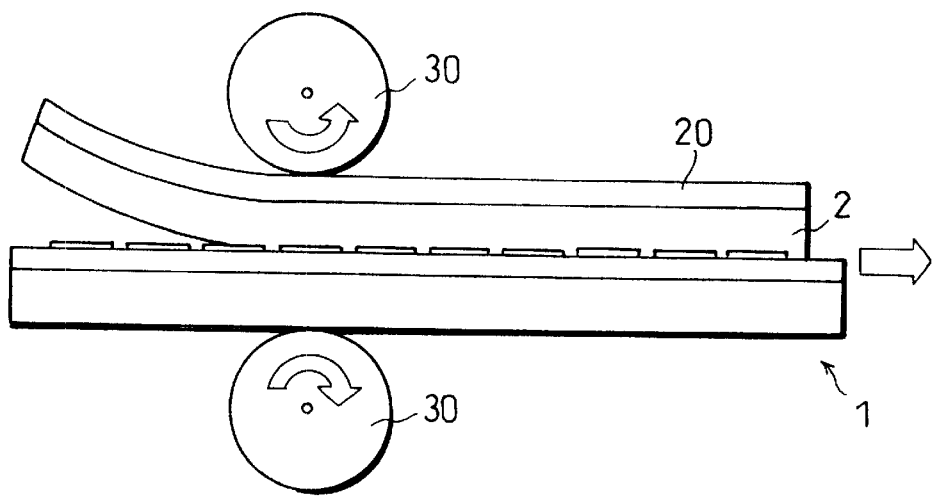
FIG. 4 is an explanatory drawing showing a transfer operation for transferring the photoconductive layer from the discrete substrate to an active matrix substrate.

First, as shown in FIG. 4, the active matrix substrate 1 is placed on a transfer device having heat rollers 30, and the photoconductive layer 2 being formed on the transfer substrate 20 is placed over the active matrix substrate 1. Here, in order to ensure adhesion between the photoconductive layer 2 and the active matrix substrate 1, the two members are heated at or above the softening point of the binder 22 while pressing them against each other with the heat rollers 30. By being heated, the binder 22 making up the photoconductive layer 2 is softened, and as a result the photoconductive layer 2 adheres to the active matrix substrate 1.

Figure 5:
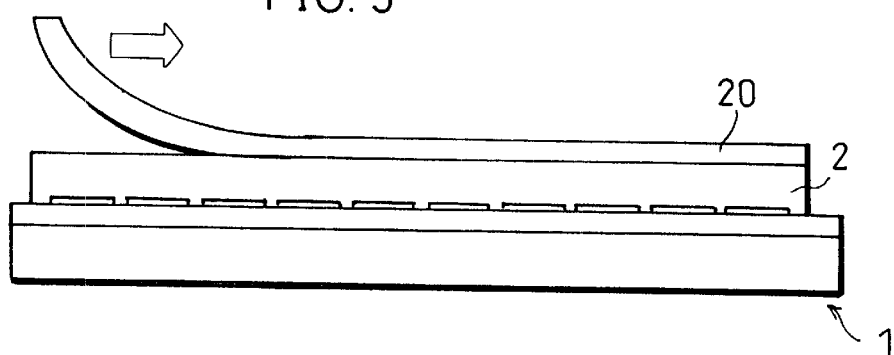
FIG. 5 is an explanatory drawing showing a transfer operation for transferring the photoconductive layer from the discrete substrate to the active matrix substrate.
Figure 6:
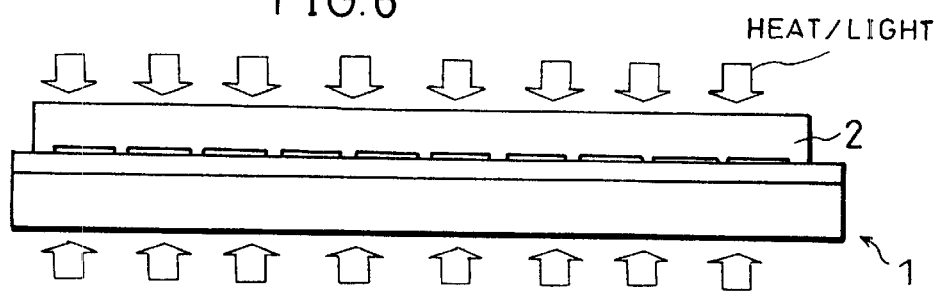
FIG. 6 is an explanatory drawing showing a transfer operation for transferring the photoconductive layer from the discrete substrate to the active matrix substrate.

Then, as shown in FIG. 5, the transfer substrate 20 is detached from the photoconductive layer 2. Then, as required, as shown in FIG. 6, the photoconductive layer 2 is subjected to the heating process or light irradiation process so as to set and stabilize the binder 22, thereby finishing the transfer operation of transferring the photoconductive layer 2 onto the active matrix substrate 1. Note that, in the case where the intermediate layer is provided between the photoconductive layer 2 and the transfer substrate 20, the intermediate layer is detached from the photoconductive layer 2 when detaching the transfer substrate 20 from the photoconductive layer 2, or at an appropriate timing before the next step.

Then, by the vacuum vapor deposition method, a gold film is deposited in the thickness of around 200 nm on the photoconductive layer 2 so as to form the common electrodes 3 (step 10), thereby fabricating the two-dimensional imaging detector.

As described, the two-dimensional image detector in accordance with the present embodiment includes at least the active matrix substrate 1 having a plurality of pixel electrodes 10; and the photoconductive layer 2 which is stacked on the pixel electrodes 10, wherein the photoconductive layer 2 is transferred to the active matrix substrate 1 after being formed in a predetermined thickness on the transfer substrate 20. That is, the fabrication method of the two-dimensional image detector in accordance with the present invention is the method in which the photoconductive layer 2 is formed in advance in a predetermined thickness on the transfer substrate 20 and then transferred to the active matrix substrate 1.

With this arrangement, since the photoconductive layer 2 is formed in advance in a predetermined thickness on the transfer substrate 20, compared with the case where the photoconductive layer 2 is directly formed (deposited) on the active matrix substrate 1, for example, by the vacuum vapor deposition method or coating method, the material, method, and condition, etc., of forming the photoconductive layer 2 can be suitably selected from a wider selection (wider selection is available). That is, because the photoconductive layer 2 is not directly formed on the active matrix substrate 1, the material, method, and condition of forming the photoconductive layer 2 can be suitably selected from a wide selection irrespective of the heat resistant temperature of the active matrix substrate 1.

More specifically, since the photoconductive layer 2 in the form of a sheet is formed in advance on the transfer substrate 20, compared with the case where the photoconductive layer 2 is directly formed on the active matrix substrate 1, it is possible to improve various conditions associated with the formation of the photoconductive layer 2, for example, such as environment conditions of temperature and humidity, etc., selection of material for the transfer substrate 20, selection of the device to be used for forming the photoconductive layer 2, and a degree of freedom such as a formation rate. Further, by performing quality check of the photoconductive layer 2 prior to the transfer to the active matrix substrate 1, i.e., by performing quality check of the photoconductive layer 2 on the transfer substrate 20, for example, portions of uneven thickness or defect pin holes, etc., can be removed so as to supply only acceptable photoconductor layer 2 to the manufacture of the two-dimensional image detector. Thus, the quality and yield (productivity) of the two-dimensional image detector can be further improved. Further, by using the flexible transfer substrate 20, the photoconductive layer 2 in the form of a sheet can be formed continuously and further efficiently by a so-called roll-to-roll method.

Therefore, the photoconductive layer 2 can employ various materials (photoconductive materials) for which the vacuum vapor deposition method was difficult to apply, while their sensitivity to, for example, X-rays was superior, and also productivity of the photoconductive layer 2 can be improved. Further, it is possible to easily form a photoconductive layer 2 having superior uniformity in thickness and composition and having a (wide) thickness of, for example, 700 μm to 3000 μm. Further, since the photoconductive layer 2 is not directly formed on the active matrix substrate 1, the photoconductive layer 2 can also be formed easily on the active matrix substrate 1 having a large area. As a result, it is possible to productively (efficiently) and inexpensively (easily) provide a two-dimensional image detector having superior uniformity in thickness and composition of the photoconductive layer 2 with respect to the entire active matrix substrate 1.

Further, the two-dimensional image detector in accordance with the present embodiment includes the photoconductive layer 2 which includes a mixture of particulate photoconductors 21 and a binder 22. Thus, by suitably combining the photoconductors 21 and the binder 22, it is possible to form the photoconductive layer 2 which is suitable for a transfer operation (transfer process) for transferring the photoconductive layer 2 from the transfer substrate 20 to the active matrix substrate 1. Also, the photoconductive layer 2 can employ various materials (photoconductive materials) which were conventionally difficult to deposit.

Further, the two-dimensional image detector in accordance with the present embodiment has the binder 22 whose softening point is not more than the heat resistant temperature of the active matrix substrate 1. This allows the photoconductive layer 2 to be easily transferred to the active matrix substrate 1, for example, by heat transfer, in addition to reducing a thermal load of transfer on the active matrix substrate 1, thus preventing deterioration of the active matrix substrate 1.

Further, even though the foregoing embodiment described the case where the photoconductive layer 2 is transferred to the active matrix substrate 1 by heat transfer. However, without limiting to this, transfer by other methods using light is also applicable. Here, an example of transfer using light will be explained. First, a light detachment layer (intermediate layer) which loses adhesive property by irradiation of light is provided on the transfer substrate 20. Then, the photoconductive layer 2 is formed on the light detachment layer. That is, the light detachment layer is provided between the photosensitive layer 2 and the transfer substrate 20. Then, light (UV light, etc.) is projected from the rear side of the transfer substrate 20 (surface where the photosensitive layer 2 is not provided) while the photosensitive layer 2 is being pressed against the active matrix substrate 1. As a result, the light detachment layer loses adhesive property to allow easy separation of the photoconductive layer 2 from the transfer substrate 20, thus transferring the photoconductive layer 2 onto the active matrix substrate 1.

The two-dimensional image detector of the present invention includes the photosensitive layer 2 which preferably includes a mixture of particulate photoconductors and a binder.

With this arrangement, by suitably combining the photoconductors and the binder, it is possible to easily form the photoconductive layer which is suitable for a transfer operation (transfer process) of transferring the photosensitive layer to the active matrix substrate. Further, the photosensitive layer can employ various materials (photoconductive materials) which were conventionally difficult to deposit.

The two-dimensional image detector of the present invention includes the binder which preferably has a softening point not more than the heat resistant temperature of the active matrix substrate.

With this arrangement, the photoconductive layer can easily be transferred onto the active matrix substrate, for example, by heat transfer, and the thermal load of transfer on the active matrix substrate can be reduced, thereby preventing deterioration of the active matrix substrate.

In the fabrication method of the two-dimensional image detector of the present invention, the transfer is preferably heat transfer.

With this method, since the photoconductive layer is formed, for example, using a binder whose softening point is not more than the heat resistant temperature of the active matrix substrate, the thermal load of transfer on the active matrix substrate can be reduced, thus preventing deterioration of the active matrix substrate.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A method of making a two-dimensional image detector, the method comprising:

forming a photoconductive layer on a discrete substrate, and after forming the photoconductive layer on the discrete substrate, transferring the photoconductive layer from the discrete substrate onto an active matrix substrate having a plurality of pixel electrodes so that as a result of the transferring the discrete substrate is detached from the photoconductive layer.

2. The method as set forth in claim 1, wherein the transferring comprises the use of heat transfer.

3. The method of claim 1, wherein said discrete substrate is a flexible sheet.

4. The method of claim 1, further comprising providing an intermediate layer between said photoconductive layer and said discrete substrate in said forming step.

5. The method of claim 1, wherein said photoconductive layer includes a mixture of particulate photoconductors and a binder.

6. The method of claim 5, wherein the binder contains a radiation resistant additive.

7. The method of claim 5, wherein the binder has a softening point which is not more than a heat resistant temperature of the active matrix substrate.

* * * * *